US008362808B2

(12) United States Patent
Kurimoto

(10) Patent No.: US 8,362,808 B2
(45) Date of Patent: Jan. 29, 2013

(54) TRANSMISSION INPUT CIRCUIT

(75) Inventor: Mitsuhiro Kurimoto, Tokyo (JP)

(73) Assignee: Hochiki Corporation, Tokyo (JP)

( * ) Notice: Subject to any disclaimer, the term of this patent is extended or adjusted under 35 U.S.C. 154(b) by 29 days.

(21) Appl. No.: 13/121,866

(22) PCT Filed: Oct. 2, 2009

(86) PCT No.: PCT/JP2009/005116

§ 371 (c)(1), (2), (4) Date: Mar. 30, 2011

(87) PCT Pub. No.: WO2010/038480

PCT Pub. Date: Apr. 8, 2010

(65) Prior Publication Data

US 2011/0187415 A1 Aug. 4, 2011

(30) Foreign Application Priority Data

Oct. 2, 2008 (JP) ................................ 2008-257172

(51) Int. Cl.
*H03K 5/153* (2006.01)
*H03K 5/22* (2006.01)

(52) U.S. Cl. ................ 327/58; 327/60; 327/72; 327/77; 327/18; 327/205

(58) Field of Classification Search ........................ None
See application file for complete search history.

(56) References Cited

U.S. PATENT DOCUMENTS

| | | | | |
|---|---|---|---|---|
| 5,266,884 | A * | 11/1993 | Agiman | 323/284 |
| 5,274,273 | A * | 12/1993 | Baginski et al. | 327/72 |
| 6,215,334 | B1 * | 4/2001 | Pernyeszi | 327/73 |
| 7,102,396 | B2 * | 9/2006 | Tsuchida et al. | 327/143 |
| 2005/0162207 | A1 * | 7/2005 | Kamei | 327/205 |

FOREIGN PATENT DOCUMENTS

| | | |
|---|---|---|
| JP | 62-276694 | 12/1987 |
| JP | 06-301876 | 10/1994 |
| JP | 09-091576 | 4/1997 |
| JP | 2004-102888 | 4/2004 |

OTHER PUBLICATIONS

International Search Report issued on PCT application No. PCT/JP2009/005116, mailed on Jan. 12, 2010.

* cited by examiner

*Primary Examiner* — Tuan T Lam

(74) *Attorney, Agent, or Firm* — Wood, Herron & Evans, LLP

(57) ABSTRACT

A transmission input circuit of the present invention is provided with: a current detection resistor which receives an input of a line current flowing through a transmission line and generates a line current detection voltage; a constant current circuit which generates a predetermined reference current; a first switch which performs a switching operation at an empty timing where a transmission current is not flowing, to thereby allow the reference current to flow from the constant current circuit to the current detection resistor, and generate a reference voltage, in which a threshold voltage corresponding to the reference current is added to a load current detection voltage corresponding to the load current; a capacitor which is connected to the current detection resistor via the first switch; a second switch which performs a switching operation in synchronization with the first switch to thereby sample-hold the reference voltage generated by the current detection resistor in the capacitor; and a comparator which receives an input of the line current detection voltage generated by means of the current detection resistor, to one of input terminals, receives an input of the reference voltage held in the capacitor to an other input terminal, and outputs a voltage component of the line current detection voltage which exceeds the reference voltage, as a transmission current detection signal.

2 Claims, 10 Drawing Sheets

(A)

(B)

(A)

(B)

TRANSMISSION INPUT CIRCUIT

TECHNICAL FIELD

The present invention relates to a transmission input circuit of a master device such as a receiver device which detects transmission current from a slave device such as a fire hazard sensor which is connected thereto via a transmission line serving also as a power supply line.

Priority is claimed on Japanese Patent Application No. 2008-257172, filed Oct. 2, 2008, the contents of which are incorporated herein by reference.

BACKGROUND ART

In a conventional monitoring system, a sensor such as a fire hazard sensor and gas sensor is connected from a receiver device to a transmission line extending to monitor for abnormalities such as a gas leakage (for example, refer to Patent Documents 1 and 2). In this monitoring system, a digital signal, which is a downstream signal such as control information, is transmitted in a voltage mode from the receiver device to a terminal. Meanwhile, the terminal transmits a digital signal, which is an upstream signal such as sensor information, in a current mode to the receiver device.

FIG. 6 shows the conventional monitoring system. As shown in the diagram, transmission lines 102*a* and 102*b* serving also as power supply lines are led out from a receiver device 100 serving as a master device, and an analog type sensor 104 and a relay device 106 serving as slave devices are connected thereto. To the analog type sensor 104 and the relay device 106, there are respectively set a unique address.

The analog type sensor 104 detects a concentration of smoke caused by a fire hazard occurrence or an analog value of the surrounding temperature, and transmits smoke concentration data or temperature data to the receiver device 100. The receiver device 100 determines the presence or absence of a fire hazard occurrence based on the smoke concentration data or the temperature data, and issues a fire hazard warning if a fire hazard occurrence is determined.

Sensor lines 108*a* and 108*b* are led out from the relay device 106, and a plurality of ON/OFF type sensors 110 which do not have a transmitting function, are connected thereto as loads. When the ON/OFF type sensor 110 detects an indication of a fire hazard occurrence, it allows an alarm current to flow to the relay device 106 via the sensor lines 108*a* and 108*b*. When the relay device 106 receives this alarm current, fire hazard alarm data is transmitted from the relay device 106 to the receiver device 100. Then, the receiver device 100 issues a fire hazard warning.

The receiver device 100 sequentially specifies a slave device address, and transmits a polling downstream signal to respective slave devices (the analog type sensor 104 and the relay device 106) in a voltage mode. The slave device which has received this polling downstream signal distinguishes its own address, and returns a transmission current serving as an upstream signal which indicates a normal state, to the receiver device 100.

FIG. 7 is a diagram which shows, with an equivalent circuit, the receiver device 100, the analog type sensor 104, and the relay device 106 in the conventional system shown in FIG. 6. The relay device 106 supplies electric power to the ON/OFF type sensors 110 connected thereto as a load, to thereby steadily supply operating current, and therefore the ON/OFF type sensors 110 can be treated as the load 122 illustrated as a resistor. Accordingly, load current Iz from the load 122 steadily flows to the transmission lines 102*a* and 102*b*.

The analog type sensor 104 is provided with a constant current source 112 and a switch 114. In the analog type sensor 104, for example, with respect to the polling from the receiver device 100, a CPU 116 returns an upstream signal indicating normality to the receiver device 100 with a current pulse signal of a predetermined bit length.

The current pulse signal transmitted from the analog type sensor 104 is input to a transmission input circuit 118 of the receiver device 100, and a current detection voltage pulse signal proportional to this current pulse signal is generated and transmitted to a CPU 120. As a result, the CPU 120 which has read the current detection voltage pulse signal recognizes the analog type sensor 104 as being normal. That is to say, in a state where the load 122 is flowing the load current Iz to the transmission lines 102*a* and 102*b* serving also as power supply lines, the transmission input circuit 118 detects the presence or absence of transmission current from the analog type sensor 104 serving as a slave device.

FIG. 8 is a circuit diagram of the conventional transmission input circuit 118 provided in the receiver device 100 shown in FIG. 7. In FIG. 8, in the transmission input circuit 118, a predetermined power supply voltage Vc is applied to the transmission line 102*a*, while the signal line 102*b* side is connected to a current detection resistor R11 via a diode D11.

As shown in FIG. 7, the relay device 106 and the analog type sensor 104 are connected to the transmission lines 102*a* and 102*b*, and a load current Iz dependant on the load 122 of the relay device 106 is flowed at an empty timing where no transmission current is flowing. When the analog type sensor 104 outputs a transmission signal, a transmission current Ia with the load current Iz added thereto flows.

A detection voltage according to the line current which is produced at both ends of the current detection resistor R11 shown in FIG. 8 is applied to the negative input terminal of a comparator 122. A capacitor C11 is connected to the positive input terminal of the comparator 122, and the capacitor C11 is further connected to the input side of the diode D11 via a switch SW11.

The switch SW11 is switched by the CPU 120 at an empty timing where transmission current Ia from the slave devices such as the analogy type sensor 104 is not flowing, and it sample-holds in the capacitor C11, a reference voltage Vr in which a threshold voltage Vf serving as a forward drop voltage of the diode D11 is added to a load current detection voltage Vz of the current detection resistor R11, that is, Vr=(Va+Vf).

FIG. 9 is a time chart showing a signal waveform of each section in FIG. 8. FIG. 9 (A) shows the input voltage of the comparator 122, and FIG. 9 (B) shows the timing of sampling of the capacitor C11 performed by the switch SW11.

As shown in FIG. 9 (A), a load current detection voltage Vz due to a load current Iz flowing through the transmission lines 102*a* and 102*b* in a state where transmission current Ia is not present, is input as a base voltage. Moreover, with switching of the switch SW1 at an empty timing with no transmission current Ia, a reference voltage Vr, in which the threshold voltage Vf serving as the forward drop voltage of the diode D11 is added to the load current detection voltage Vz of the current detection resistor R11, is sample-held in the capacitor C11.

When a transmission current Ia flows due to transmission of a transmission signal from a slave device, at the current detection resistor R11, there is produced a transmission current detection voltage Va corresponding to the transmission current Ia, having the load current detection voltage Vz added thereto. The comparator 122 extracts a reception voltage component (voltage pulse component) which exceeds the reference voltage Vr=(Vz+Vf) held in the capacitor C11, and inputs this as a transmission current detection signal to the CPU 120 which then performs a fire hazard warning process or the like.

FIG. 10 is a time chart shown with the time axis of FIG. 9 contracted. Pulse signals are transmitted from the slave device side at a constant cycle, and at an empty timing thereof, a reference voltage Vr=(Vz+Vf), in which a threshold voltage Vf serving as a forward drop voltage of the diode D11 is added to a load current detection voltage Vz, is sample-held in the capacitor C11. Then, a voltage component which exceeds the reference voltage Vr of a transmission current detection voltage Va obtained immediately thereafter is detected, and input to the CPU 120 as a transmission current detection signal.

Although the load voltage Vz corresponding to the load current Iz is shown as a constant voltage, the load current gently changes according to the environment temperature and the like.

PRIOR ART DOCUMENTS

Patent Documents

[Patent Document 1] Japanese Unexamined Patent Application, First Publication No. H09-91576

[Patent Document 2] Japanese Unexamined Patent Application, First Publication No. H06-301876

Problems to be Solved by the Invention

In the conventional transmission input circuit, the threshold voltage Vf for detecting a transmission current from a slave device is determined depending on the forward voltage Vf of the diode D11. Therefore there is a problem in that an arbitrary threshold voltage cannot be set. Moreover variation therein caused by temperature is significant, and a sufficient level of reliability cannot be ensured.

DISCLOSURE OF INVENTION

The present invention takes consideration the above circumstances, with an object of providing a transmission input circuit in which a threshold voltage for detecting transmission current can be arbitrarily set, and no variation occurs therein due to temperature, enabling an accurate detection of transmission current.

Means for Solving the Problem

In order to solve the above problems and achieve the object, the present invention employs following measures.

(1) A transmission input circuit of a master device which, in a state where a load current from a load is flowing into a transmission line serving also as a power supply line, detects the presence or absence of a transmission current from a slave device connected to the transmission line, the transmission input circuit being provided with: a current detection resistor which receives an input of a line current flowing through the transmission line and generates a line current detection voltage; a constant current circuit which generates a predetermined reference current; a first switch which performs a switching operation at an empty timing where the transmission current is not flowing, to thereby allow the reference current to flow from the constant current circuit to the current detection resistor, and generate a reference voltage, in which a threshold voltage corresponding to the reference current is added to a load current detection voltage corresponding to the load current; a capacitor which is connected to the current detection resistor via the first switch; a second switch which performs a switching operation in synchronization with the first switch to thereby sample-hold the reference voltage generated by the current detection resistor in the capacitor; and a comparator which receives an input of the line current detection voltage generated by means of the current detection resistor, to one input terminals, receives an input of the reference voltage held in the capacitor to an other input terminal, and outputs a voltage component of the line current detection voltage which exceeds the reference voltage, as a transmission current detection signal.

(2) In the transmission input circuit according to (1) above, there may be employed a configuration such that the constant current circuit supplies current, which generates a threshold voltage being ½ of the transmission current detection voltage corresponding to the transmission current, as the reference current.

Effect of the Invention

According to the present invention, a threshold voltage for detecting transmission current which is transmitted from a slave device and is received while being added on a load current, is determined by means of a predetermined reference current flowed by a constant current source. Therefore the threshold value can be set to an arbitrary value. Moreover, since the current is supplied from a constant current source, the threshold voltage does not change due to temperature, and the transmission current can be reliably detected so that a high level of reliability can be ensured.

Furthermore, even if there is an error in the current detection resistor, by adjusting the current from the constant current source so as to eliminate the influence of this error, it is possible to reliably detect transmission current without being influenced by the error in the current detection resistor.

BEST MODE FOR CARRYING OUT THE INVENTION

Figure 1:
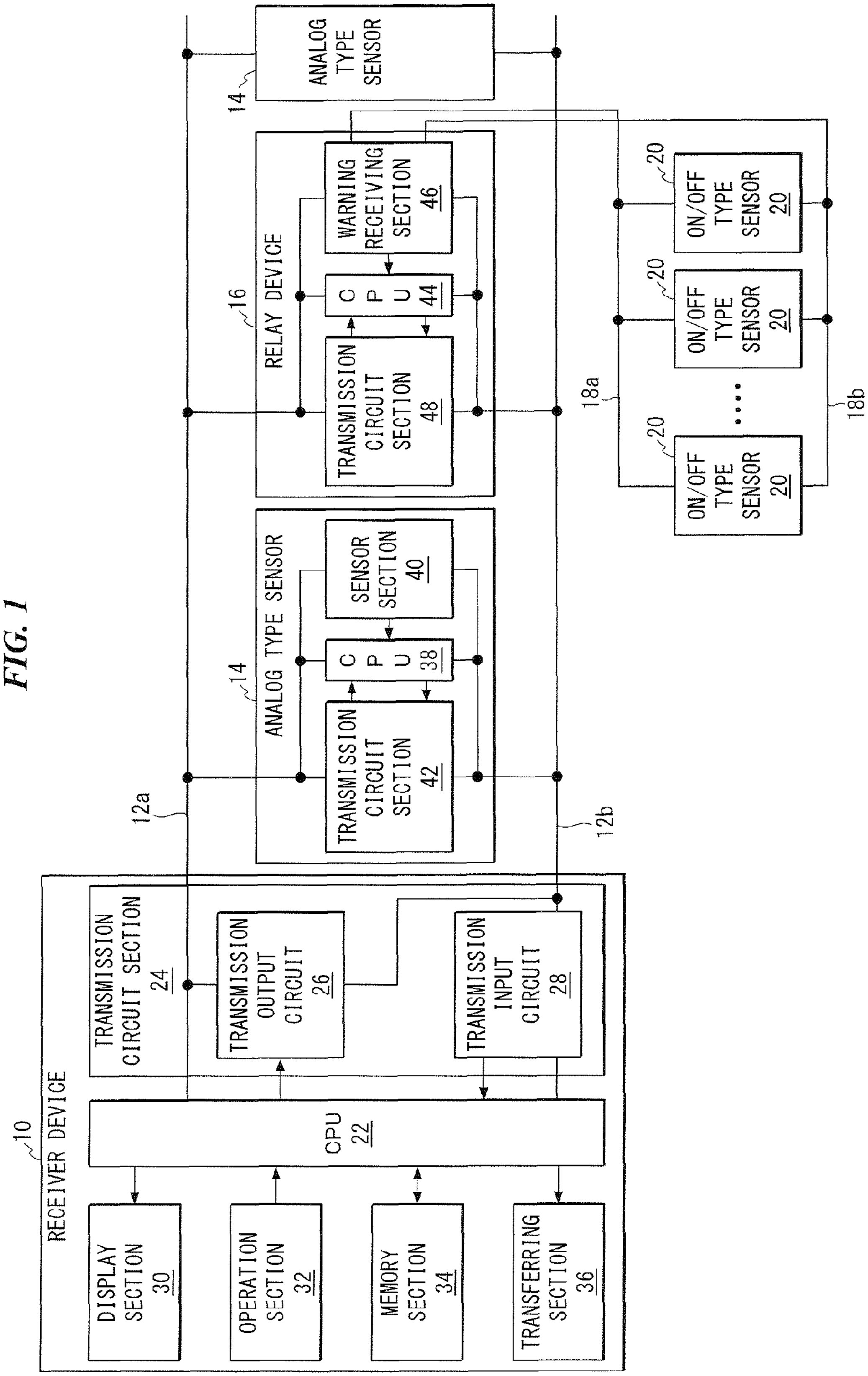
FIG. 1 is a block diagram showing a receiving device together with an analog type sensor and a relay device, in a monitoring system to which the present invention is applied.

FIG. 1 is a block diagram showing a configuration of a receiving device together with an analog type sensor and a relay device, in a monitoring system to which the present invention is applied. In FIG. 1, in the monitoring system to which the present invention is applied, an analog type sensor 14 and a relay device 16 serving as slave devices are severally connected to transmission lines 12*a* and 12*b* which are led out from a receiver device 10 serving as a master device, towards a monitoring area.

The analog type sensor 14 and the relay device 16 are provided with a transmission function which transmits and receives upstream signals and downstream signals to and from the receiver device 10. A unique address with a maximum of 127 addresses per transmission line, is preliminarily assigned to the analog type sensor 14 and to the relay device 16.

The analog type sensor 14 detects a concentration of smoke (smoke concentration) occurring due to a fire hazard or a temperature (room temperature for example), and transmits the detected value to the receiving device 10 as analog data. Meanwhile, in the receiver device 10, the presence or absence of a fire hazard occurrence is determined based on the received analog data of the smoke concentration or temperature, and a warning is issued if an occurrence of a fire hazard is determined.

The relay device 16 is provided so as to connect a plurality of ON/OFF type sensors 20, which do not have a transmission function, to the transmission lines 12*a* and 12*b*. The relay device 16 has a function to perform transmission to and from the receiver device 10. Each of the ON/OFF type sensors 20 is connected to sensor lines 18*a* and 18*b* led out from the relay device 16. The ON/OFF type sensor 20, when a fire hazard is detected, supplies an alarm current between the sensor lines 18*a* and 18*b*, and this alarm current is received by the relay device 16, and fire hazard alarm data indicating a fire hazard occurrence is transmitted to the receiver device 10.

Downstream signals transmitted from the receiver device 10 to the analog type sensor 14 and the relay device 16 serving as slave devices, are transmitted in a voltage mode. For example, the receiver device 10 sequentially specifies a slave device address at a constant polling cycle, and transmits a polling signal. This polling signal is transmitted as a voltage pulse which varies the voltage between the transmission lines 12*a* and 12*b* between 18 volt and 30 volt for example.

On the other hand, upstream signals transmitted from the analog type sensor 14 and the relay device 16 to the receiver device 10, are transmitted in a current mode. That is to say, a signal current is supplied between the transmission lines 12*a* and 12*b* at the timing of bit 1 of the transmission data, and an upstream signal is transmitted to the receiver device 10 as a so-called current pulse sequence, and transmission current flows at this time.

The transmission lines 12*a* and 12*b* are also used as power supply lines for the analog type sensor 14 and the relay device 16 serving as slave devices. That is to say, in the transmission lines 12*a* and 12*b*, the supply voltage is varied in a range between 18 volt and 30 volt at the time of downstream signal transmission in the voltage mode, and at least voltage supply at 18 volt is performed. That is to say, power supply is continuously performed from the receiver device 10 serving as a master device, to the analog type sensor 14 and the relay device 16 serving as slave devices.

Electric power supplied through the transmission lines 12*a* and 12*b* is also supplied via the relay device 16 to the sensor lines 18*a* and 18*b* led out from the relay device 16. As a result, electric power is supplied to each of the ON/OFF type sensors 20 via the sensor lines 18*a* and 18*b*.

In the receiver device 10, there are provided a CPU 22 and a transmission circuit section 24 corresponding to the CPU 22. Moreover, the transmission lines 12*a* and 12*b* are led out from the transmission circuit section 24.

In the transmission circuit section 24 there are provided a transmission output circuit 26, and a transmission input circuit 28 according to one embodiment of the present invention. The transmission output circuit 26 outputs a downstream signal to the transmission lines 12*a* and 12*b* in the voltage mode, based on a command instruction such as a polling instruction from the CPU 22.

When the transmission input circuit 28 receives an upstream signal transmitted in the current mode from the analog type sensor 14 or the relay device 16 serving as a slave device, that is, a transmission current, it outputs a transmission current detection signal indicating this reception to the CPU 22, which makes the CPU 22 perform a fire hazard warning operation.

In the receiver device 10, to correspond to the CPU 22, there are provided a display section 30, an operation section 32, a memory section 34, and an transferring section 36, and various types of operations required for fire hazard monitoring including; warning output, warning display, operation, memorizing monitoring information, and information transfer signal output, can be performed.

In the analog type sensor 14, there are provided a CPU 38, a sensor section 40, and a transmission circuit section 42. The sensor section 40 detects a concentration of smoke (smoke concentration) occurring due to a fire hazard occurrence, or a temperature, and outputs it to the CPU 38.

The transmission circuit section 42 receives a downstream signal of a polling command which specifies its own address from the receiver device 10, and if the CPU 38 determines normality, an upstream signal indicating normality is transmitted to the receiver device 10 in the current mode. When a fire hazard is detected, the CPU 38 transmits a fire hazard alarm signal, which is a fire hazard interruption upstream signal, to the receiver device 10 so as to respond to the polling command which specified its own address.

In the relay device 16, there are provided a CPU 44, an alarm receiving section 46, and a transmission circuit section 48. The sensor lines 18*a* and 18*b* are led out from the alarm receiving section 46, and each ON/OFF type sensor 20 is connected as a load to these sensor lines 18*a* and 18*b*.

When the ON/OFF type sensor 20 detects a fire hazard occurrence, an alarm current is supplied between the sensor lines 18*a* and 18*b*, and the alarm receiving section 46 receives this alarm current and output it to the CPU 44. Consequently, by means of the transmission circuit 48, the CPU 44 transmits a fire hazard interruption upstream signal to the receiver device 10 so as to respond to the polling command, which specified its own address.

As with the analog type sensor 14, when a downstream signal of the polling command from the receiver device 10 specifying its own address is received, the relay device 16 also transmits an upstream signal indicating normality to the receiver device 10 in the current mode if there is no abnormality.

Hereunder is a detailed description of a transmission process performed between the receiver device 10 and slave devices.

When normal monitoring is being performed, the receiver device 10 is transmitting a polling command for normal monitoring which sequentially specifies the address of the slave device. The analog type sensor 14 and the relay device 16 perform a normal monitoring response when a polling command which matches their own set address is received. Accordingly, based on the presence or absence of a response to the polling command, the receiver device 10 can detect the presence or absence of failure in the analog type sensor 14 or the relay device 16.

The analog type sensor 14 receives a batch AD conversion command which is repeatedly output at a cycle of polling command transmission of the receiver device 10, to all of sensor addresses. When it is received, the analog type sensor 14, by means of a fire hazard detection mechanism (sensor section 40) provided therein, samples analog detection data such as smoke concentration and temperature, compares it with a pre-defined fire hazard level, and determines a fire hazard occurrence detection if it exceeds this fire hazard level.

In the analogy type sensor 14, when a fire hazard occurrence is determined from the sampling result based on the batch AD conversion command, it transmits a fire hazard interruption signal to the receiver device 10 at the subsequent polling command transmission timing which specifies its own sensor address. As the fire hazard interruption signal, there is used a signal which is not normally used such as one which sets all response bits to 1.

The relay device 16 also samples the state of reception performed by the alarm receiving section 46 based on the batch AD conversion command from the receiving device 10. When the alarm reception is detected, the relay device 16 transmits a fire hazard interruption signal to the receiving device 10 at the subsequent timing where a polling command which specifies its own sensor address is transmitted.

When the receiving device 10 receives the fire hazard interruption signal from the analog type sensor 14 or the relay device 16, it issues a group search command, and receives a fire hazard interruption response from the group including the analog type sensor 14 or the relay device 16 which has detected a fire hazard, to thereby determine the group. Subsequently, the receiving device 10 sequentially specifies the address of each of the analog type sensor 14 and the relay device 16 included in the determined group, performs polling with respect thereto, and receives a fire hazard response (analog data or fire hazard alarm data), to thereby recognizes the sensor address of the analog type sensor 14 or the relay device 16 which has detected the fire hazard, and perform a fire hazard warning operation.

The analog type sensors 14 and the relay devices 16 of a maximum 127 units connected to the transmission lines 12*a* and 12*b*, have a group address set to each 8 units thereof for example. With respect to the group search command transmitted from the receiving device 10, there is performed a fire hazard interruption response from the group which includes the analog type sensor 14 which has detected the fire hazard occurrence. Thereby, it is possible to identify the group which contains the analog type sensor 14 or the relay device 16 which has detected the fire hazard occurrence.

Figure 2:
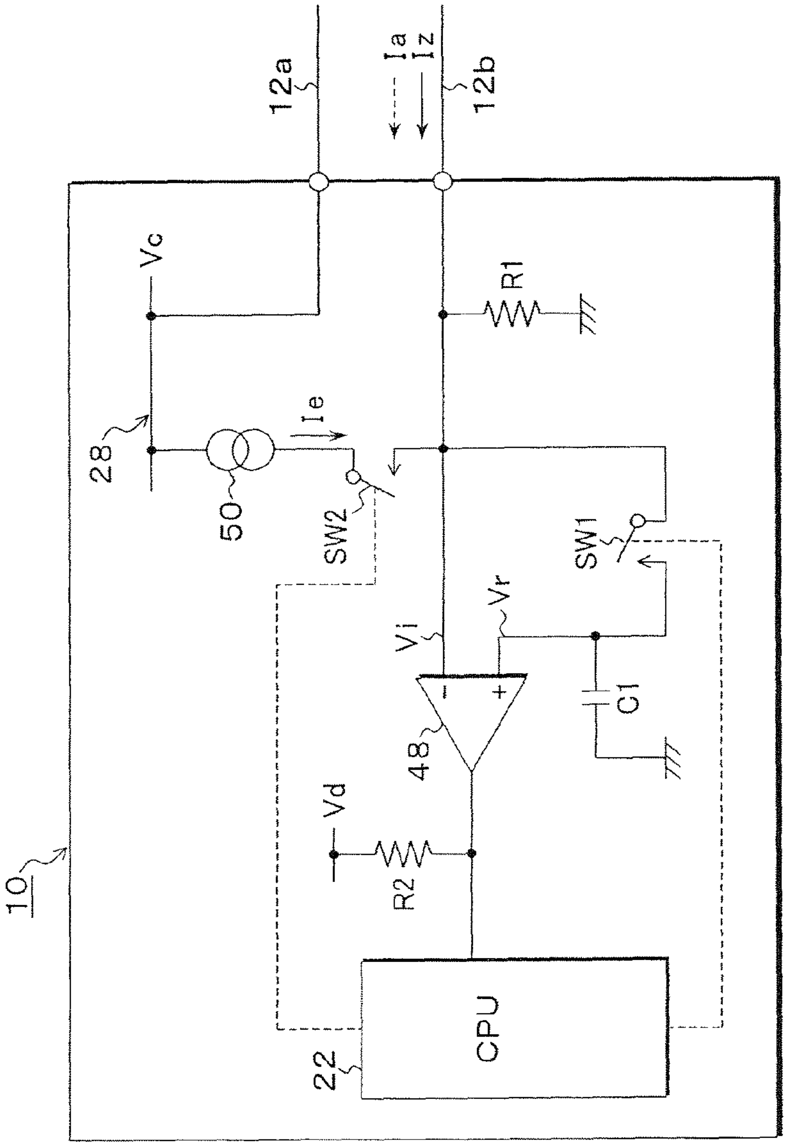
FIG. 2 is a circuit diagram showing an embodiment of a transmission input circuit of the present invention.

FIG. 2 is a circuit diagram showing a configuration of the transmission input circuit 28 according to one embodiment of the present invention. As shown in FIG. 2, the transmission input circuit 28 provided in the receiving device 10 is provided with; a current detection resistor R1, a comparator 48, a capacitor C1, a first switch SW1, a second switch SW2, a constant current circuit 50, and a pull-up resistor R2.

If a predetermined power supply voltage Vc is applied to the positive side transmission line 12*a*, a load current Iz flows to the negative side transmission line 12*b* where the relay device 16 shown in FIG. 1 serves as a constant load for example. Furthermore, as a response to the polling performed by the analog type sensor 14 or the relay device 16 shown in FIG. 1, a transmission current Ia flows to the transmission line 12*b* at constant intervals.

Figure 3:
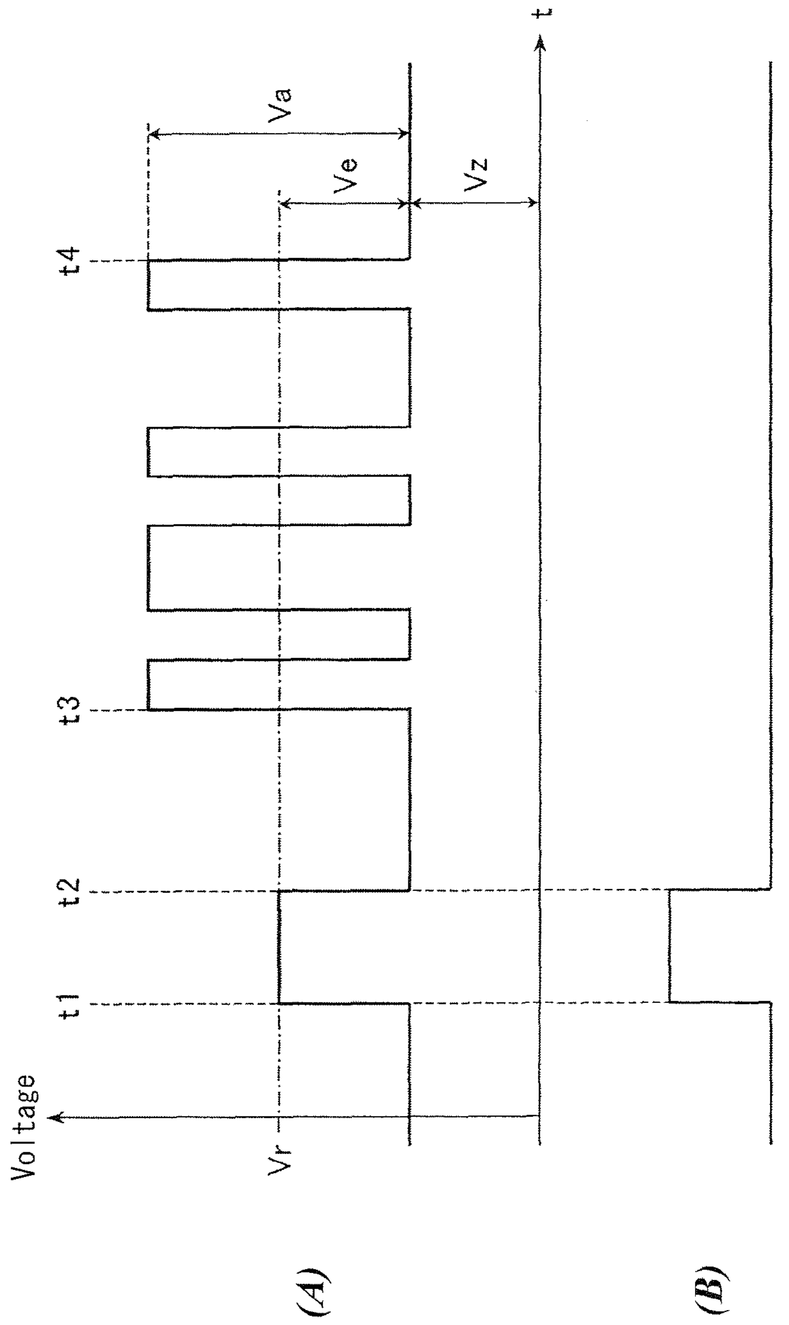
FIG. 3 is a time chart showing comparator input voltage and sample-hold timing in the embodiment of FIG. 2.

The line current flowing to the transmission line 12*b* is supplied to the current detection resistor R1, and is converted to a line current voltage Vi. The line current voltage Vi becomes a load current detection voltage Vz corresponding to the load current Iz in the case where no transmission current is being supplied from the slave device. Then, as shown in FIG. 3 (A), there is produced a voltage with the load current detection voltage Vz serving as the base thereof, and there is produced a transmission current detection voltage Va due to the transmission current Ia in a state of being added to this load current detection voltage Vz.

The load current Iz is a current which flows in a state where the ON/OFF type sensor 20 connected primarily to the relay device 16 serves as a load. However, to be precise, it is a current which combines this with the steady consumption current of the analog type sensor 14 and the relay device 16.

The current detection resistor R1 is connected to the negative input terminal of the comparator 48. To the positive input terminal of the comparator 48, there is connected the capacitor C1. The capacitor C1 is connected via the first switch SW1, to an input line of the negative input terminal of the comparator 48, to which the current detection resistor R1 is connected. Moreover, to the input line for the negative input terminal and the positive input terminal of the comparator 48, there is connected via the second switch SW2, the constant current circuit 50 on the power supply line of the power supply voltage Vc.

The first switch SW1 and the second switch SW2 are turned ON and OFF at an empty timing of transmission current from the slave device, under control performed by the CPU 22. At the empty timing of transmission current from the slave device, only the load current Iz serving as a base current due to the load of the relay device 16 shown in FIG. 1 flows. Therefore a load current detection voltage Vz corresponding to the load current Iz is produced in the current detection resistor R1.

Consequently, when the first switch SW1 is turned ON by the CPU 22 at the transmission current empty timing, the base load current detection voltage Vz produced in the current detection resistor R1 at this time is sample-held in the capacitor C1.

In the present embodiment, the CPU 22 turns the first switch SW1 and the second switch SW2 ON and OFF simultaneously, and thereby a predetermined reference current Ie flows from the constant current circuit 50 to the current detection resistor R1 via the second switch SW2. Consequently, there is added a threshold voltage Ve due to the reference current Ie in a state of being added to the load current detection voltage Vz produced in the current detection resistor R1 due to the load current Iz. As a result, in the capacitor C1, there is held a reference voltage Vr=(Vz+Ve) in which the threshold voltage Ve corresponding to the reference current Ie is added to the load current detection voltage Vz.

After the reference voltage Vr=(Vz+Ve) has been held in the capacitor C1 in this manner, when the transmission current Ia is supplied from the slave device side and flows to the current detection resistor R1, there is produced a transmission current detection voltage Va corresponding to the transmission current Ia in a state of being added to the load current detection voltage Vz, and this is applied to the negative input terminal of the comparator 48.

The comparator 48 compares the received voltage (Vz+Va) applied to the negative input terminal with the sample-held reference voltage Vr=(Vz+Ve), and outputs to the CPU 22, a transmission current detection signal corresponding to the portion of the transmission current detection voltage Va which exceeds the reference voltage Vr. Specifically, it outputs to the CPU 22, a transmission current detection signal in which the portion of the transmission current detection voltage Va exceeding the reference voltage Vr is inverted to an L level.

FIG. 3 is a time chart showing the timing of the comparator input voltage and the sample-holding mentioned above. FIG. 3 (A) shows the input side voltage of the comparator 48 shown in FIG. 2, and FIG. 3 (B) shows the timing of the sample-holding which turns ON and OFF the first switch SW1 and the second switch SW2.

First, the first switch SW1 and the second switch SW2 are turned ON during a period of time between time t1 and time t2 at the empty timing where there is no transmission current from the slave device. Before this time t1, which is a sample-hold timing, the line current is only the load current Iz due to the load of the relay device 16 or the like shown in FIG. 1. Therefore only the load current detection voltage Vz corresponding to the load current Iz is produced in the current detection resistor R1.

If the first switch SW1 and the second switch SW2 are turned ON in this state as shown in the period of time between the time t1 and time t2, then in addition to the load current Iz from the transmission line 12*b*, the reference current Ie from the constant current circuit 50 due to turning ON the second switch SW2, flow to the current detection resistor R1. Therefore, at both ends of the current detection resistor R1 there is produced a reference voltage Vr=(Vz+Ve) in which the threshold voltage Ve corresponding to the reference current Ie is added to the load current detection voltage Vz. In addition, since the first switch SW1 is also turned ON simultaneously at this time, the reference voltage Vr of the detection resistor R1 is sample-held in the capacitor C1.

Here, in the present embodiment, the reference current Ie which flows from the constant current circuit 50 is determined so that the threshold voltage Ve which is produced due to the reference current Ie from the constant current circuit 50, becomes half of the transmission current detection voltage Va corresponding to the transmission current Ia from the slave device, that is, Ve=Va/2 as shown in FIG. 3 (A).

Following the period of time between the time t1 and time t2, when the pulsed transmission current Ia flows at a timing between the time t3 and time t4 due to the transmission of the upstream signal from the slave device, in the current detection resistor R1 there is produced a transmission current detection voltage Va corresponding to the transmission current Ia, in a state of being added to the load current detection voltage Vz corresponding to the load current Iz.

With respect to this transmission current detection voltage Va, in the capacitor C1 there is held a reference voltage Vr=(Vz+Ve) such that the threshold voltage Ve which is half of the change in the transmission current detection voltage Va is added to the load current detection voltage Vz. Consequently, as for the portion of the transmission current detection voltage Va which exceeds the reference voltage (Vz+Ve), the comparator 48 outputs to the CPU 22, a transmission current detection signal in an inverted pulse sequence in which the exceeding portion is at the L level and the under portion is at the H level.

As described above, in the present embodiment, by adjusting the constant current Ie which is flowed for detecting the transmission current at the transmission current empty timing, the reference voltage Vr to be sample-held in the capacitor C1 of the comparator 48 is arbitrarily adjusted, and the constant current Ie is adjusted so that preferably as shown in FIG. 3 (A), a threshold voltage Ve which is half of the transmission current detection voltage Va can be obtained.

Moreover, the threshold voltage Ve which determines the reference voltage Vr=(Vz+Ve) is determined by the constant current Ie flowed by the constant current circuit 50, and the constant current circuit 50 is not influenced by temperature. Therefore, the reference voltage Vr=(Vz+Ve) will not be changed by temperature. Consequently, by reliably detecting the transmission current Ia flowing in a state of being added to the load current Iz, a high level of reliability can be ensured.

Figure 4:
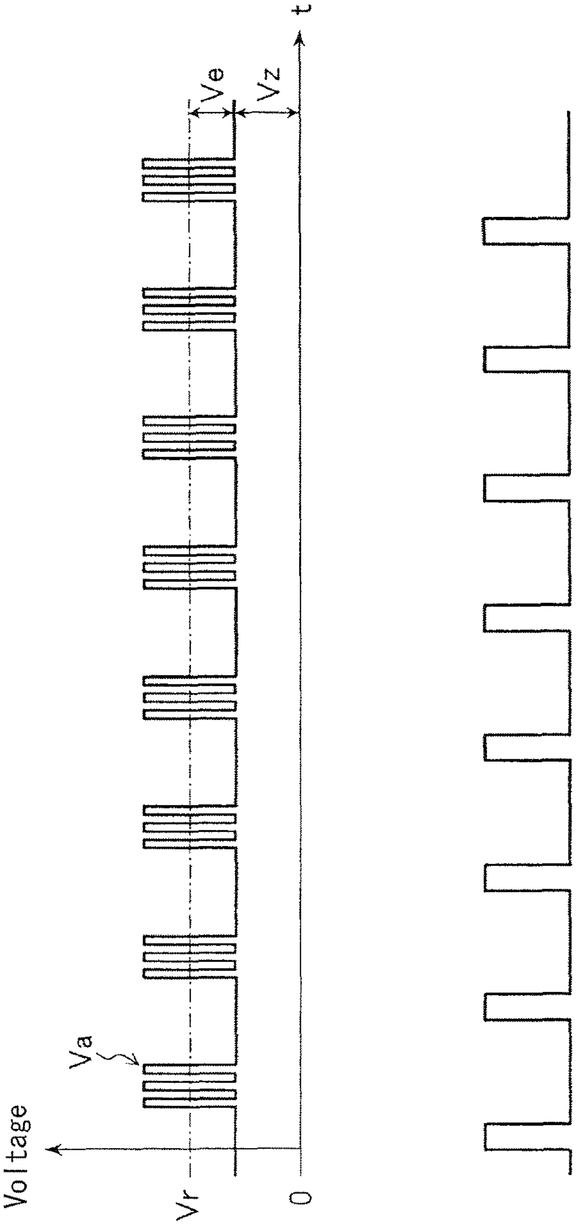
FIG. 4 is a time chart showing comparator input voltage and sample-hold timing in a case where load current is stable.

(A) and (B) of FIG. 4 are time charts showing the input voltage to the comparator 48 and the sample-holding timing in a case where the load current Iz is stable. FIG. 4 (A) shows the line current detection voltage to be input to the comparator 48. In the case where there is no variation in the load due to the relay device 16 shown in FIG. 1, the load current detection voltage Vz is constant, and the transmission current detection voltage Va is added in a state of being added thereto. In addition, the reference voltage Vr−(Vz+Ve) is set so that the threshold voltage Ve becomes half of the change in the transmission current detection voltage Va.

Figure 5:
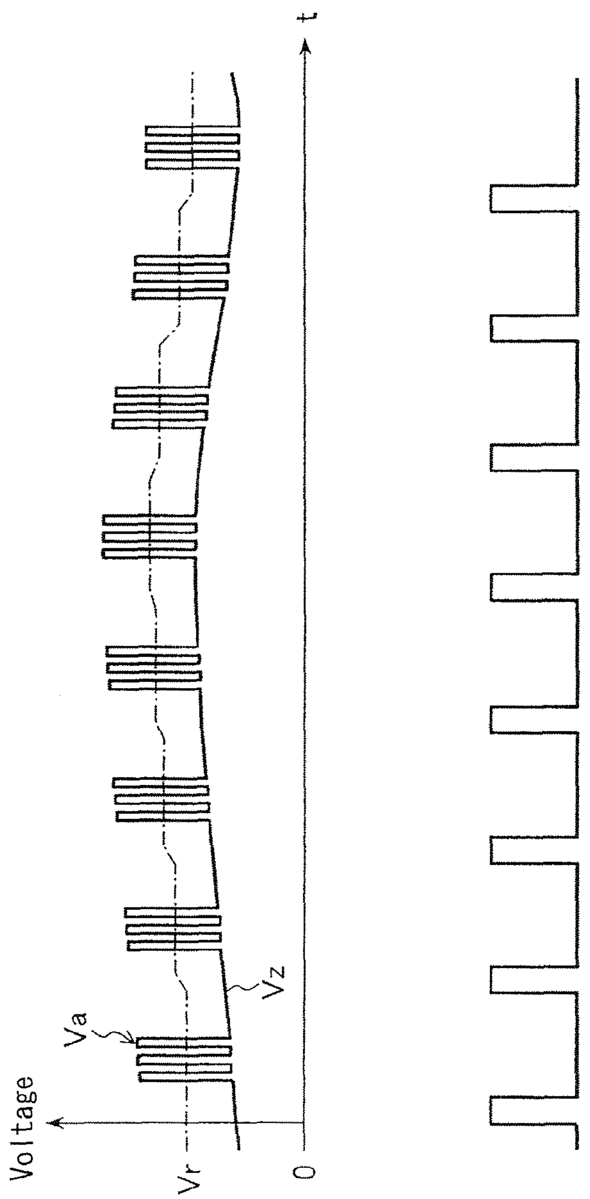
FIG. 5 is a time chart showing comparator input voltage and sample-hold timing in a case where load current varies.
Figure 6:
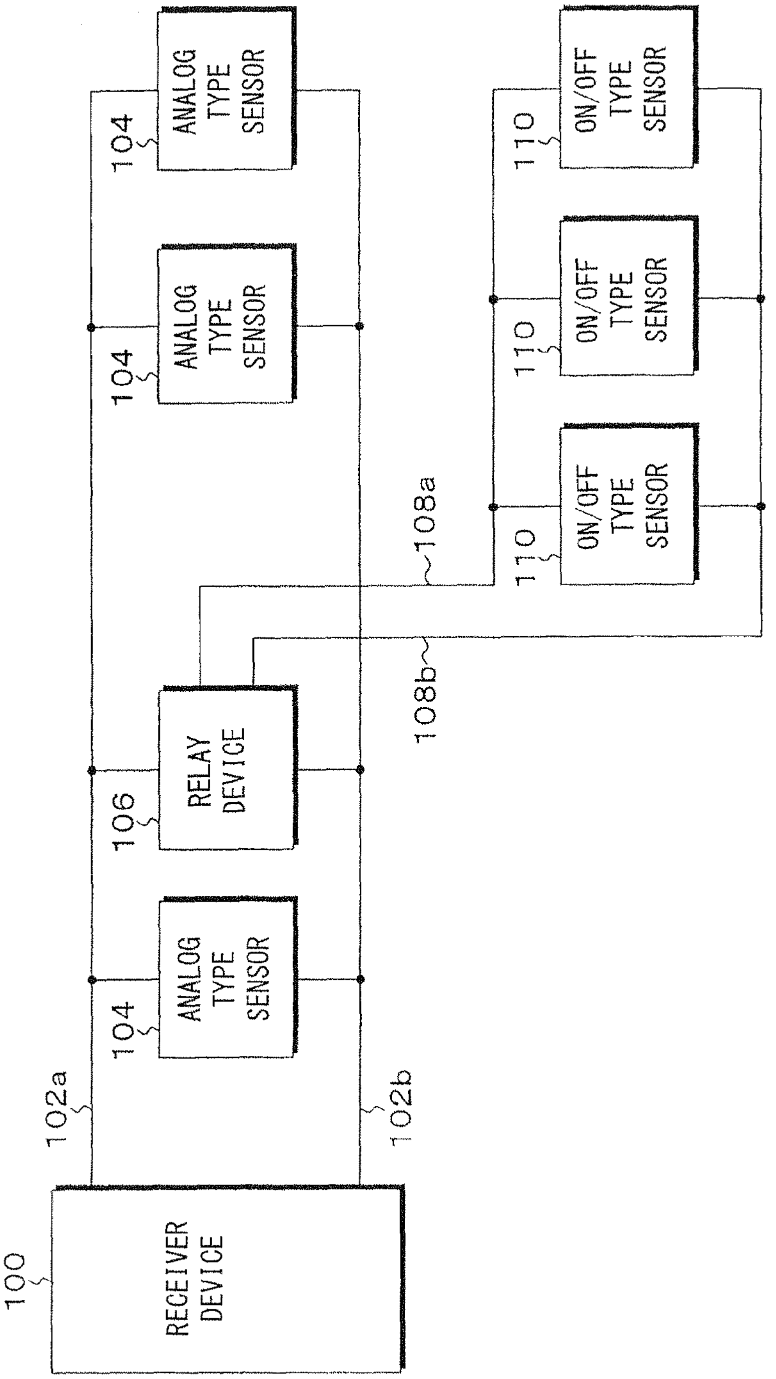
FIG. 6 PRIOR ART
FIG. 6 is a system block diagram showing a conventional monitoring system.
Figure 7:
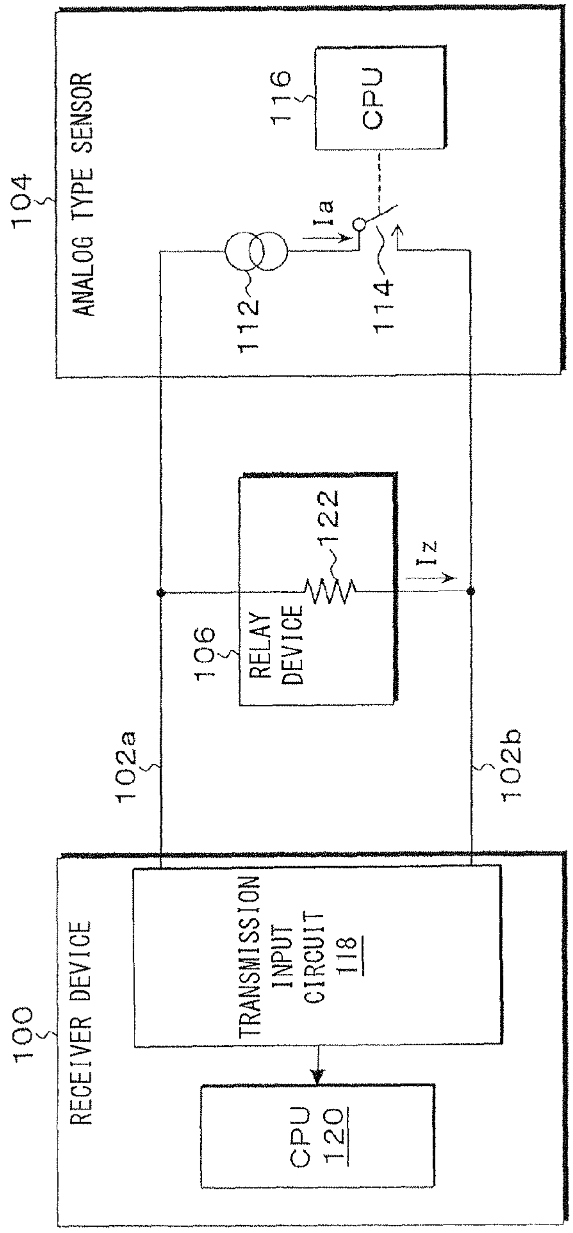
FIG. 7 PRIOR ART
FIG. 7 is a block diagram showing, with an equivalent circuit, a relay device and an analog type sensor in the conventional monitoring system.
Figure 8:
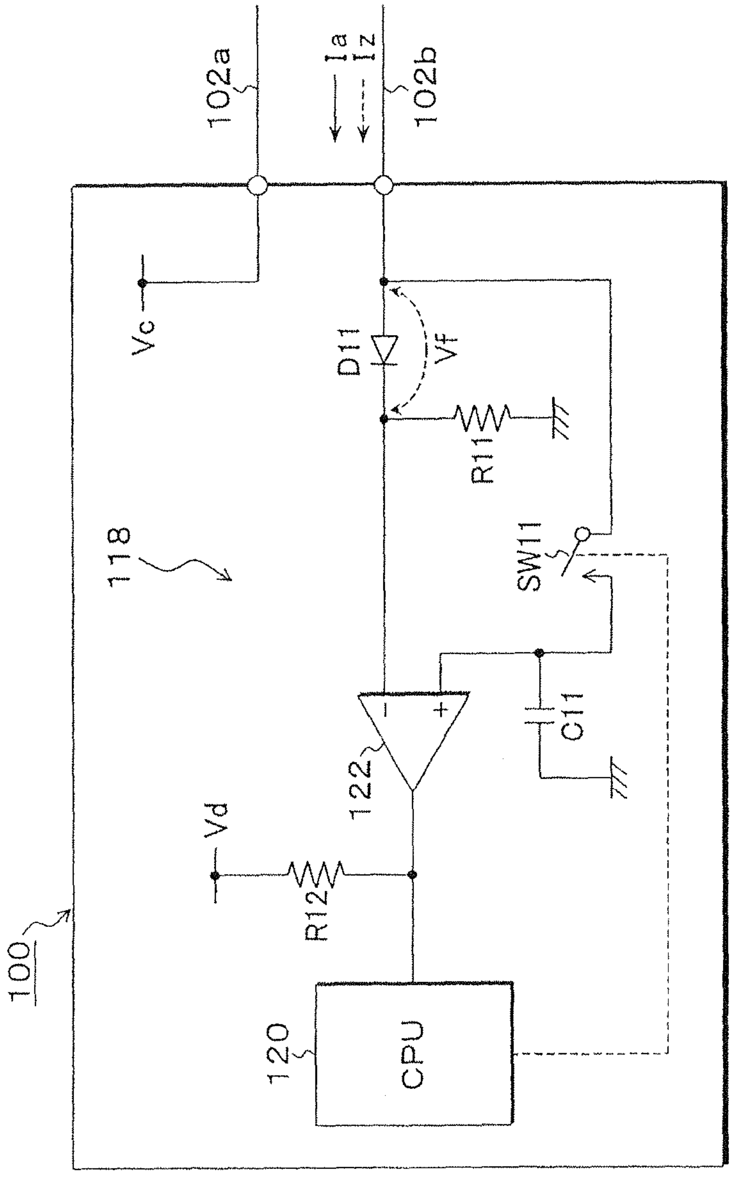
FIG. 8 PRIOR ART
FIG. 8 is a circuit diagram showing a conventional transmission input circuit.
Figure 9:
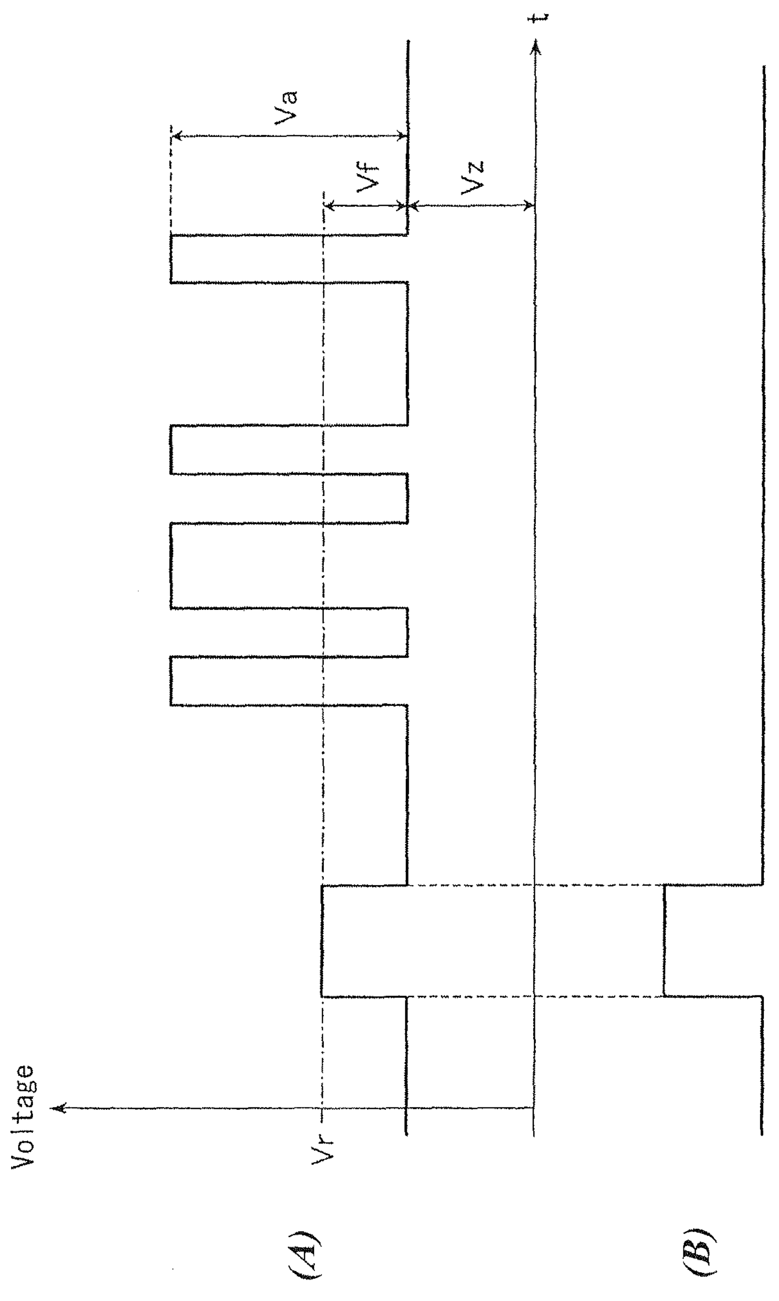
FIG. 9 PRIOR ART
FIG. 9 is a time chart showing comparator input voltage and sample-hold timing in the conventional transmission input circuit shown in FIG. 8.
Figure 10:
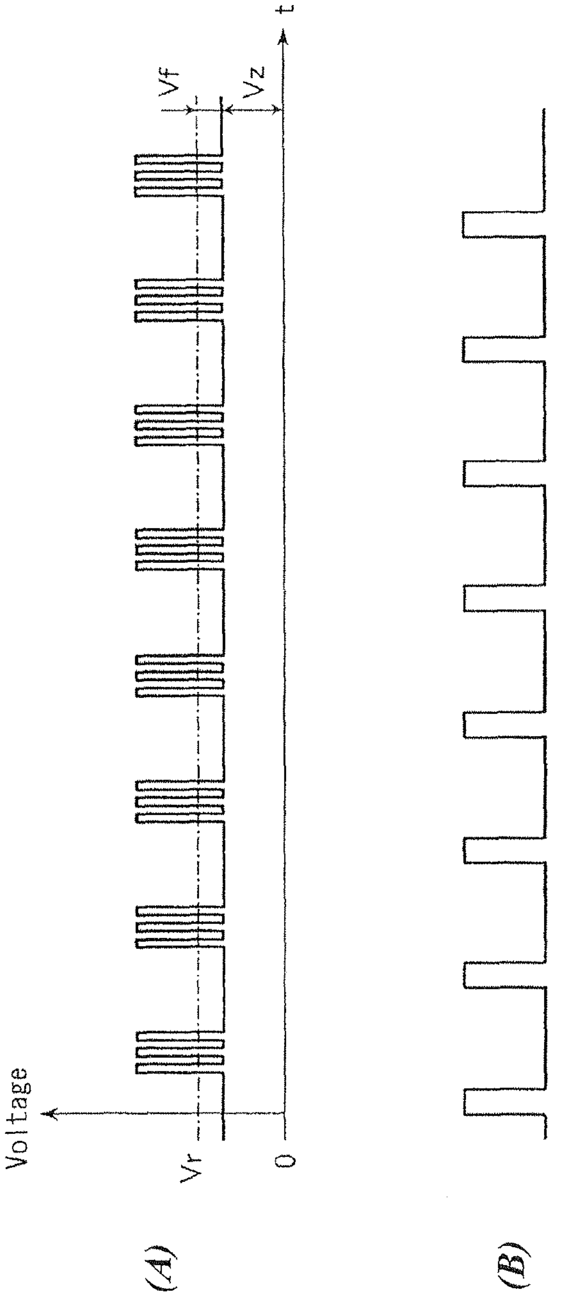
FIG. 10 PRIOR ART
FIG. 10 is a time chart showing comparator input voltage and sample-hold timing in the conventional transmission input circuit in a case where load current is stable.

(A) and (B) of FIG. 5 are time charts showing the input voltage to the comparator 48 and the sample-holding timing in a case where the load current Iz varies. The comparator input voltage shown with FIG. 5 (A) indicates that the load current Iz due to the relay device 16 shown in FIG. 1 changes over time, and as a result, the load current detection voltage Vz varies. In a state of being added to the load current detection voltage Vz which changes in this fashion, there is produced the transmission current detection voltage Va based on the transmission current Ia supplied from the slave device at constant intervals.

By performing sample-holding at the transmission current empty timing shown in FIG. 5 (B), the reference voltage Vr is set to a value in which a threshold voltage Ve corresponding to the constant current Ie supplied by the constant current circuit 50 is added to the load current detection voltage at the time of the sample-holding. Consequently the threshold voltage Ve is always constant although the reference voltage Vr changes so as to follow the changes in the load current detection voltage Vz. Therefore it is possible to maintain the reference voltage Vr at an optimum level which is half of the transmission current detection voltage Va produced in a state of being added to the load current detection voltage Vz. Hence it is possible to reliably detect transmission current even when the load current Iz changes.

In the above embodiment, the case of connecting the relay device 16 as a constant load for the transmission lines 12*a* and 12*b* is taken as an example. However, other than this, the case of connecting a gas leakage alarm or a theft alarm via a relay device 16 is similar to this case.

Moreover, the present invention includes appropriate modified examples which do not impair the object and advantage thereof. Further, it is not limited by just the numerical values illustrated in the above embodiment.

INDUSTRIAL APPLICABILITY

According to the present invention, a threshold voltage for detecting transmission current, which is transmitted from a slave device and is received while being added to a load current, is determined with a predetermined reference current flowed by a constant current source. Therefore the threshold value can be set to an arbitrary value. Moreover, since it is supplied from a constant current source, the threshold voltage does not change due to temperature, transmission current can be reliably detected, and a high level of reliability can be ensured.

Furthermore, even if there is an error in the current detection resistor, by adjusting current from the constant current source so as to eliminate the influence of this error, it is possible to reliably detect transmission current without being influenced by the error in the current detection resistor.

DESCRIPTION OF REFERENCE SYMBOLS

10 Receiver device
12*a*, 12*b* Transmission line
14 Analog type sensor
16 Relay device
18*a*, 18*b* Sensor line
20 ON/OFF type sensor
22, 38, 44 CPU
24 Transmission circuit section
26 Transmission output circuit
28 Transmission input circuit
30 Display section
32 Operation section
34 Memory section
36 Transferring section
40 Sensor section
42, 48 Transmission circuit section
46 Alarm receiving section
48 Comparator
50 Constant current circuit

The invention claimed is:

1. A transmission input circuit of a master device which, in a state where a load current from a load is flowing into a transmission line serving also as a power supply line, detects the presence or absence of a transmission current from a slave device connected to the transmission line, the transmission input circuit comprising:

a current detection resistor which receives an input of a line current flowing through the transmission line and generates a line current detection voltage;

a constant current circuit which generates a predetermined reference current;

a first switch which performs a switching operation at an empty timing where the transmission current is not flowing, to thereby allow the reference current to flow from the constant current circuit to the current detection resistor, and generate a reference voltage, in which a threshold voltage corresponding to the reference current is added to a load current detection voltage corresponding to the load current;

a capacitor which is connected to the current detection resistor via this first switch;

a second switch which performs a switching operation in synchronization with the first switch to thereby sample-hold the reference voltage generated by the current detection resistor in the capacitor; and a comparator which receives an input of the line current detection voltage generated by means of the current detection resistor, to one input terminal, receives an input of the reference voltage held in the capacitor to an other input terminal, and outputs a voltage component of the line current detection voltage which exceeds the reference voltage, as a transmission current detection signal.

2. The transmission input circuit according to claim 1, wherein the constant current circuit supplies current, which generates a threshold voltage being ½ of the transmission current detection voltage corresponding to the transmission current, as the reference current.

* * * * *